(12) United States Patent
Takata

(10) Patent No.: US 10,840,888 B2
(45) Date of Patent: Nov. 17, 2020

(54) MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 71 days.

(21) Appl. No.: 16/056,581

(22) Filed: Aug. 7, 2018

(65) Prior Publication Data
US 2019/0058452 A1 Feb. 21, 2019

(30) Foreign Application Priority Data

Aug. 16, 2017 (JP) ................. 2017-157234

(51) Int. Cl.
H03H 9/72 (2006.01)
H03H 9/02 (2006.01)
H03H 9/64 (2006.01)
H03H 9/145 (2006.01)
(Continued)

(52) U.S. Cl.
CPC ........ H03H 9/725 (2013.01); H03H 9/02818 (2013.01); H03H 9/14544 (2013.01); H03H 9/44 (2013.01); H03H 9/6436 (2013.01); H03H 9/6476 (2013.01); H03H 9/6483 (2013.01); H03H 9/6489 (2013.01); H04B 1/0057 (2013.01)

(58) Field of Classification Search
CPC ........... H03H 9/02818; H03H 9/14544; H03H 9/6436; H03H 9/6476; H03H 9/6483; H03H 9/6489; H03H 9/725
USPC ....................................... 333/133
See application file for complete search history.

(56) References Cited

U.S. PATENT DOCUMENTS 8,183,958 B2 * 5/2012 Fujita ............... H03H 9/0222
333/133
2013/0113576 A1 5/2013 Inoue et al.
2017/0099043 A1 4/2017 Goto et al.

FOREIGN PATENT DOCUMENTS

JP 2013-118611 A 6/2013
JP 2017-092945 A 5/2017

OTHER PUBLICATIONS

Master's thesis of Manenti, R., "Surface Acoustic Wave Resonators for Quantum Information", University of Milan, 2013 (Year: 2013).*

* cited by examiner

Primary Examiner — Benny T Lee
Assistant Examiner — Hafizur Rahman
(74) Attorney, Agent, or Firm — Keating & Bennett, LLP

(57) ABSTRACT

A multiplexer includes a transmission-side filter, a reception-side filter, and a cancel circuit connected between a node M and a node N to cancel out a component in a predetermined frequency band that flows along first and second paths. The cancel circuit includes at least one longitudinally-coupled resonator. An average pitch between electrode fingers of interdigital transducer electrodes of the at least one longitudinally-coupled resonator is narrower than an average pitch between electrode fingers of interdigital transducer electrodes of each of series arm resonators and parallel arm resonators that determine the pass band of the transmission-side filter and an average pitch between electrode fingers of interdigital transducer electrodes of each of series arm resonators and parallel arm resonators that determine the pass band of the reception-side filter.

16 Claims, 9 Drawing Sheets

(51) Int. Cl.
*H03H 9/44* (2006.01)
*H04B 1/00* (2006.01)

Tx→Ant

———— : FIRST EXAMPLE
············ : FIRST COMPARATIVE EXAMPLE
—·—·— : SECOND COMPARATIVE EXAMPLE

Ant→Rx

———— : FIRST EXAMPLE
············ : FIRST COMPARATIVE EXAMPLE
—·—·— : SECOND COMPARATIVE EXAMPLE

MULTIPLEXER

CROSS REFERENCE TO RELATED APPLICATIONS

This application claims the benefit of priority to Japanese Patent Application No. 2017-157234 filed on Aug. 16, 2017. The entire contents of this application are hereby incorporated herein by reference.

BACKGROUND OF THE INVENTION

1. Field of the Invention

The present invention relates to a multiplexer that includes an elastic wave filter.

2. Description of the Related Art

In recent years, there has been a need for a cellular phone that supports frequency bands and wireless systems, that is, a multi-band and a multi-mode. To fulfill the need, a multiplexer that separates high-frequency signals having wireless carrier frequencies is disposed next to an antenna. A duplexer that includes a cancel circuit is disclosed as a multiplexer in Japanese Unexamined Patent Application Publication No. 2013-118611. The cancel circuit includes a longitudinally-coupled elastic wave resonator and electrostatic capacities that are connected between the longitudinally-coupled elastic wave resonator and an antenna terminal and between the longitudinally-coupled elastic wave resonator and a transmission input terminal. The cancel circuit generates a cancel component that is in anti-phase with and that has the same amplitude as a component in a predetermined frequency band that flows through a transmission-side filter circuit to cancel out a component in the predetermined frequency band that flows through a reception-side filter circuit using the cancel component and to improve isolation characteristics of the duplexer.

However, it is difficult for the duplexer disclosed in Japanese Unexamined Patent Application Publication No. 2013-118611 to improve the isolation characteristics of the duplexer both in a transmission band and in a reception band without increasing an insertion loss when the cancel circuit includes the longitudinally-coupled elastic wave resonator.

SUMMARY OF THE INVENTION

Preferred embodiments of the present invention provide multiplexers that reduce or prevent degradation of insertion characteristics and that have improved isolation characteristics both in the transmission band and in the reception band.

According to a preferred embodiment of the present invention, a multiplexer includes a common connection terminal into which a high-frequency signal is input and from which a high-frequency signal is output, a first terminal, a second terminal, a first filter circuit having a pass band in a first frequency band, the first filter circuit being connected between the common connection terminal and the first terminal, a second filter circuit a pass band having a second frequency band that differs from the first frequency band, the second filter circuit being connected between the common connection terminal and the second terminal, and a cancel circuit that is connected between a first node on a first path that connects the common connection terminal and the first terminal to each other or to the first terminal and a second node on a second path that connects the common connection terminal and the second terminal to each other or to the second terminal to cancel out a component in a predetermined frequency band that flows along the first path and the second path. The cancel circuit includes at least one longitudinally-coupled resonator, and an average pitch between electrode fingers of an interdigital transducer electrode of the at least one longitudinally-coupled resonator is narrower than an average pitch between electrode fingers of an interdigital transducer electrode of a resonator that determines the pass band of the first filter circuit and an average pitch between electrode fingers of an interdigital transducer electrode of a resonator that determines the pass band of the second filter circuit.

With this structure, since the average pitch between the electrode fingers of the interdigital transducer electrode of a resonator that is included in the at least one longitudinally-coupled resonator is narrower than the average pitch between the electrode fingers of the interdigital transducer electrode of the resonator that is included in the first filter circuit and the average pitch in the second filter circuit, the attenuation band of the longitudinally-coupled resonator exists in both the transmission band and the reception band. This enables the difference in the amplitude characteristics of the multiplexer between the transmission band and the reception band to be reduced or eliminated. Accordingly, the cancel circuit is able to more successfully cancel out the component in the predetermined frequency band that flows along the first path that connects the common connection terminal and the first terminal to each other by using the cancel component that is in anti-phase. Consequently, the isolation characteristics in both the transmission band and the reception band are able to be improved.

The cancel circuit may include a capacitance element that is connected in series with the at least one longitudinally-coupled resonator.

This enables adjustment of the amplitude and phase of the cancel component that is in anti-phase with the component in the predetermined frequency band that flows along the first path that connects the common connection terminal and the first terminal to each other.

The first filter circuit may include a ladder filter. Frequencies in the second frequency band may be higher than frequencies in the first frequency band. The capacitance element may include a series arm resonator. A resonant frequency of the series arm resonator may be in the second frequency band.

This enables the isolation characteristics of the multiplexer in the reception band to be improved because the amplitude characteristics of the cancel circuit are closer to the amplitude characteristics of the multiplexer in the reception band. In addition, the electric power handling capability of the series arm resonator is able to be improved.

The capacitance element may be disposed only on one side of the cancel circuit.

In this case, as compared to a cancel circuit in which two capacitance elements are disposed in series at both ends of the longitudinally-coupled resonator (cancel circuit in which two capacitance elements are connected in series), it is only necessary for the capacitance element to have an electrostatic capacitance smaller than that of one of the two capacitance elements, and the size of the cancel circuit is able to be decreased.

The capacitance element may be connected to the first node of the cancel circuit or to the first terminal.

In this case, an impedance when the cancel circuit is viewed from the first node that is connected to the first filter circuit is able to be higher than an impedance when the cancel circuit is viewed from the second node that is connected to the second filter circuit. This reduces or prevents a signal in the frequency band of the first filter circuit from leaking from the first filter circuit toward the second filter circuit.

The cancel circuit may consist of the at least one longitudinally-coupled resonator.

In this case, the cancel circuit does not include another element other than the at least one longitudinally-coupled resonator, and accordingly, the size of the cancel circuit is able to be decreased.

According to a preferred embodiment of the present invention, a multiplexer includes a common connection terminal into which a high-frequency signal is input and from which a high-frequency signal is output, a first terminal, a second terminal, a first filter circuit having a pass band in a first frequency band, the first filter circuit being connected between the common connection terminal and the first terminal, a second filter circuit having a pass band in a second frequency band that differs from the first frequency band, the second filter circuit being connected between the common connection terminal and the second terminal, and a cancel circuit that is connected between a first node on a first path that connects the common connection terminal and the first terminal to each other or to the first terminal and a second node on a second path that connects the common connection terminal and the second terminal to each other or to the second terminal to cancel out a component in a predetermined frequency band that flows along the first path and the second path. The cancel circuit includes at least one longitudinally-coupled resonator or at least one elastic wave delay line. A resonant frequency of the at least one longitudinally-coupled resonator or the at least one elastic wave delay line is higher than frequencies in the pass band of the first filter circuit and the pass band of the second filter circuit.

With this structure, the attenuation band of the at least one longitudinally-coupled resonator is in the pass band of the first filter circuit and the pass band of the second filter circuit, but the pass band of the at least one longitudinally-coupled resonator is not in the pass band of the first filter circuit or in the pass band of the second filter circuit. Accordingly, isolation between the first filter circuit and the second filter circuit is able to be further improved.

According to preferred embodiments of the present invention, multiplexers reduce or prevent degradation of insertion characteristics and have improved isolation characteristics both in the transmission band and in the reception band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
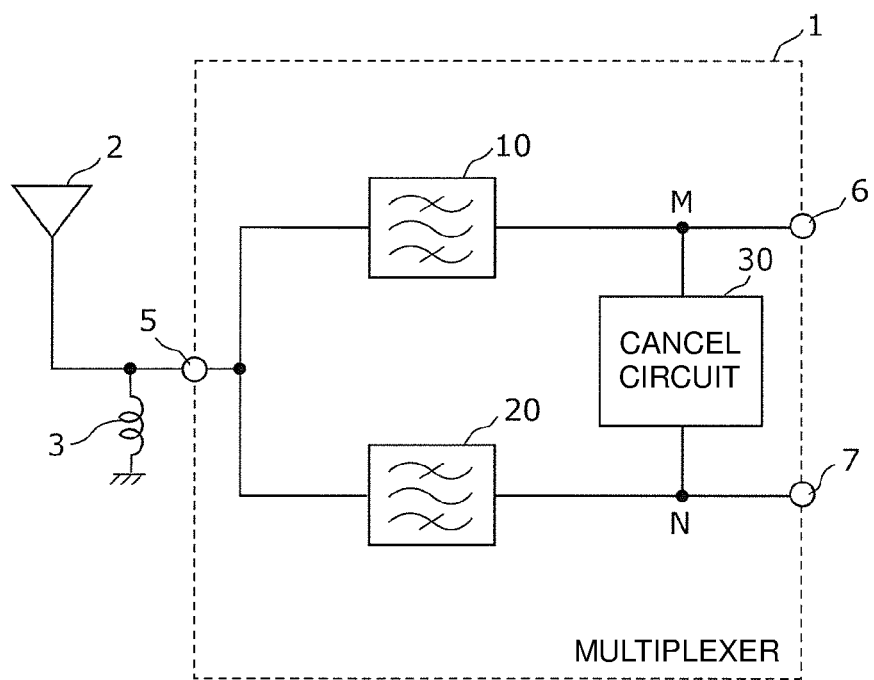
FIG. 1 is a circuit diagram of a multiplexer according to a first preferred embodiment of the present invention.

Preferred embodiments of the present invention will hereinafter be described in detail with reference to the drawings. The preferred embodiments described below are comprehensive or specific examples. In the following description of the preferred embodiments, numerical values, shapes, materials, components, and the arrangement and connection structure of the components are described by way of example and do not limit the present invention. Among the components according to the preferred embodiments described below, components that are not recited in the independent claims are described as optional components. In the drawings, the dimensions of the components and ratios of the dimensions are not necessarily illustrated strictly.

First Preferred Embodiment

FIG. 1 is a circuit diagram of a multiplexer 1 according to a first preferred embodiment of the present invention and a peripheral circuit thereof. In FIG. 1, the multiplexer 1 according to the present preferred embodiment, an antenna element 2, and a matching inductor 3 are illustrated.

The multiplexer 1 includes a transmission-side filter 10, a reception-side filter 20, a cancel circuit 30, a common connection terminal 5, a transmission-side terminal 6, and a reception-side terminal 7. The transmission-side filter 10 and the reception-side filter 20 are connected to each other at the common connection terminal 5. With this structure, the multiplexer 1 defines and functions as a duplexer. In the duplexer, a high-frequency signal that the antenna element 2 receives is output from the reception-side terminal 7 via the common connection terminal 5 and the reception-side filter 20, and a high-frequency signal that is input from the transmission-side terminal 6 is output to the antenna element 2 via the transmission-side filter 10 and the common connection terminal 5.

The transmission-side terminal 6 corresponds to a first terminal, and the reception-side terminal 7 corresponds to a second terminal. An amplifier circuit that amplifies a high-frequency signal or a radio frequency integrated Circuit (RFIC), for example, is preferably connected to the transmission-side terminal 6 and the reception-side terminal 7. The common connection terminal 5 is not necessarily connected directly to the antenna element 2 and may be connected to the antenna element 2 with a switch circuit interposed therebetween. An inductor or a capacitor that provides impedance matching may be interposed between the common connection terminal 5 and the transmission-side filter 10 or between the common connection terminal 5 and the reception-side filter 20.

The transmission-side filter 10 is a first filter circuit having a pass band in a first frequency band, and is connected to the common connection terminal 5 and the transmission-side terminal 6.

The reception-side filter 20 is a second filter circuit having a pass band in a second frequency band that differs from the first frequency band, and is connected to the common connection terminal 5 and the reception-side terminal 7.

The height relationship between the first frequency band and the second frequency band is not limited. According to various preferred embodiments of the present invention, frequencies in the second frequency band are preferably higher than frequencies in the first frequency band, for example. That is, frequencies in the pass band of the reception-side filter 20 are preferably higher than frequencies in the pass band of the transmission-side filter 10.

The cancel circuit 30 is connected between a node M on a first path that connects the common connection terminal 5 and the transmission-side terminal 6 to each other and a node N on a second path that connects the common connection terminal 5 and the reception-side terminal 7 to each other. The node M corresponds to a first node, and the node N corresponds to a second node. The cancel circuit 30 may be connected to the transmission-side terminal 6, instead of the node M, and to the reception-side terminal 7, instead of the node N.

The cancel circuit 30 generates a cancel component that is in anti-phase with and that has the same or substantially the same amplitude as a component in a predetermined frequency band that flows through the transmission-side filter 10 to cancel out a component in the predetermined frequency band that flows through the reception-side filter 20 using the cancel component. The cancel circuit 30 includes a longitudinally-coupled resonator 31. The resonant frequency of the longitudinally-coupled resonator 31 is higher than frequencies in the pass band of the transmission-side filter 10 and the pass band of the reception-side filter 20. The longitudinally-coupled resonator 31 preferably includes three elastic wave resonators 31a, 31b, and 31c, for example, that are arranged in a direction in which an elastic wave is transmitted, as described later.

The circuit structure of the multiplexer 1 will now be described in detail. The multiplexer 1 in a first example will be described as an example of the circuit structure of the multiplexer 1 according to the present preferred embodiment.

Figure 2:
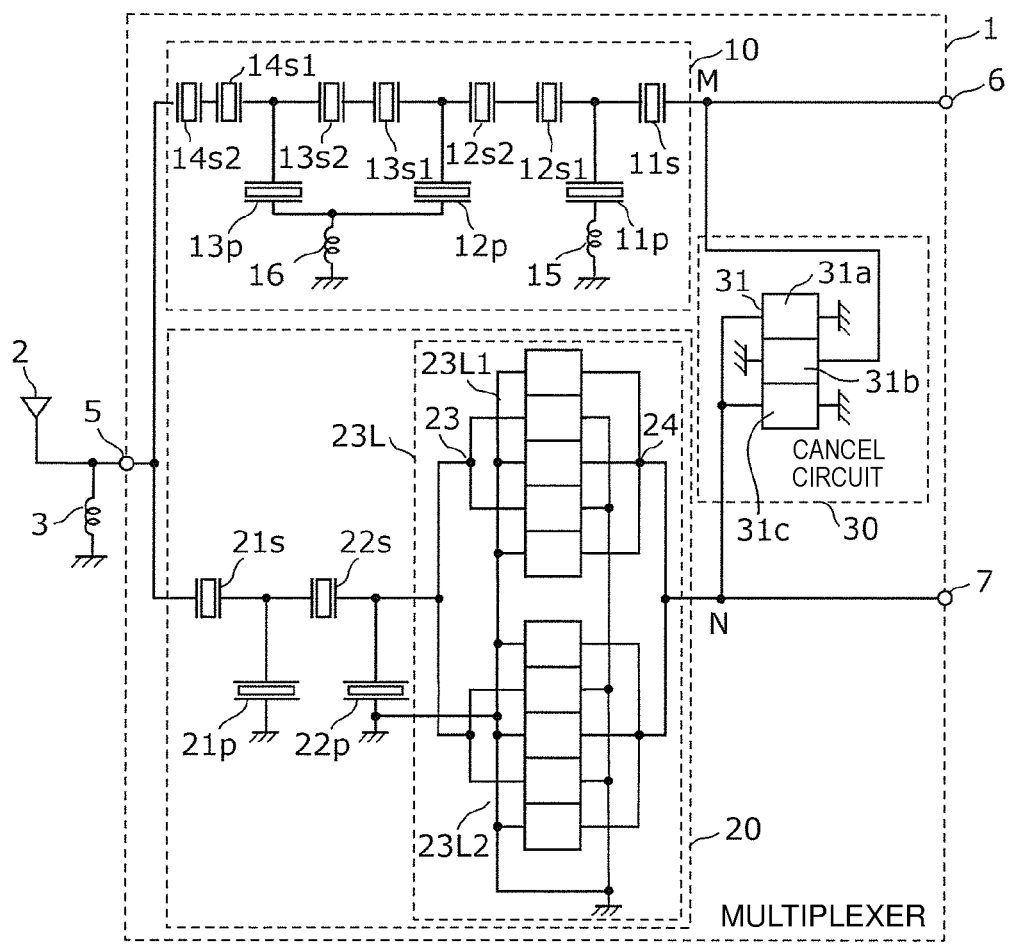
FIG. 2 is a circuit diagram of a multiplexer in a first example of a preferred embodiment of the present invention

FIG. 2 illustrates an example of a circuit structure of the multiplexer 1 in the first example. The multiplexer 1 illustrated in FIG. 2 includes the transmission-side filter 10, the reception-side filter 20, the cancel circuit 30, the common connection terminal 5, the transmission-side terminal 6, and the reception-side terminal 7, as described above.

The transmission-side filter 10 is preferably a ladder elastic wave filter circuit, for example, that includes elastic wave resonators. The transmission-side filter 10 includes series arm resonators 11s, 12s1, 12s2, 13s1, 13s2, 14s1, and 14s2, parallel arm resonators 11p, 12p, and 13p, and inductors 15 and 16. With this structure, the transmission-side filter 10 is preferably used for, for example, a transmission filter (transmission (first frequency) band of about 880 MHz to about 915 MHz) in Band8 of an LTE (Long Term Evolution) standard.

When the transmission-side filter 10 is a ladder elastic wave filter circuit, the phase does not vary in a complex manner in the attenuation band of the transmission-side filter 10, and accordingly, the longitudinally-coupled resonator 31 readily generates a cancel component that is in anti-phase with a component in the predetermined frequency band that flows along the first path that connects the common connection terminal 5 and the transmission-side terminal 6 to each other. Consequently, the use of the longitudinally-coupled resonator 31 enables the cancel circuit 30 to be more conducive to improvements in the attenuation characteristics of the transmission-side filter 10 and the isolation characteristics between the transmission-side filter 10 and the reception-side filter 20.

Each of the series arm resonator 11s to 14s2 and the parallel arm resonator 11p to 13p includes interdigital transducer electrodes that are provided on a piezoelectric substrate. That is, the transmission-side filter 10 is preferably a surface acoustic wave filter, for example, that includes the interdigital transducer electrodes that are provided on the piezoelectric substrate.

The structure of each elastic wave resonator will now be described.

Figure 3:
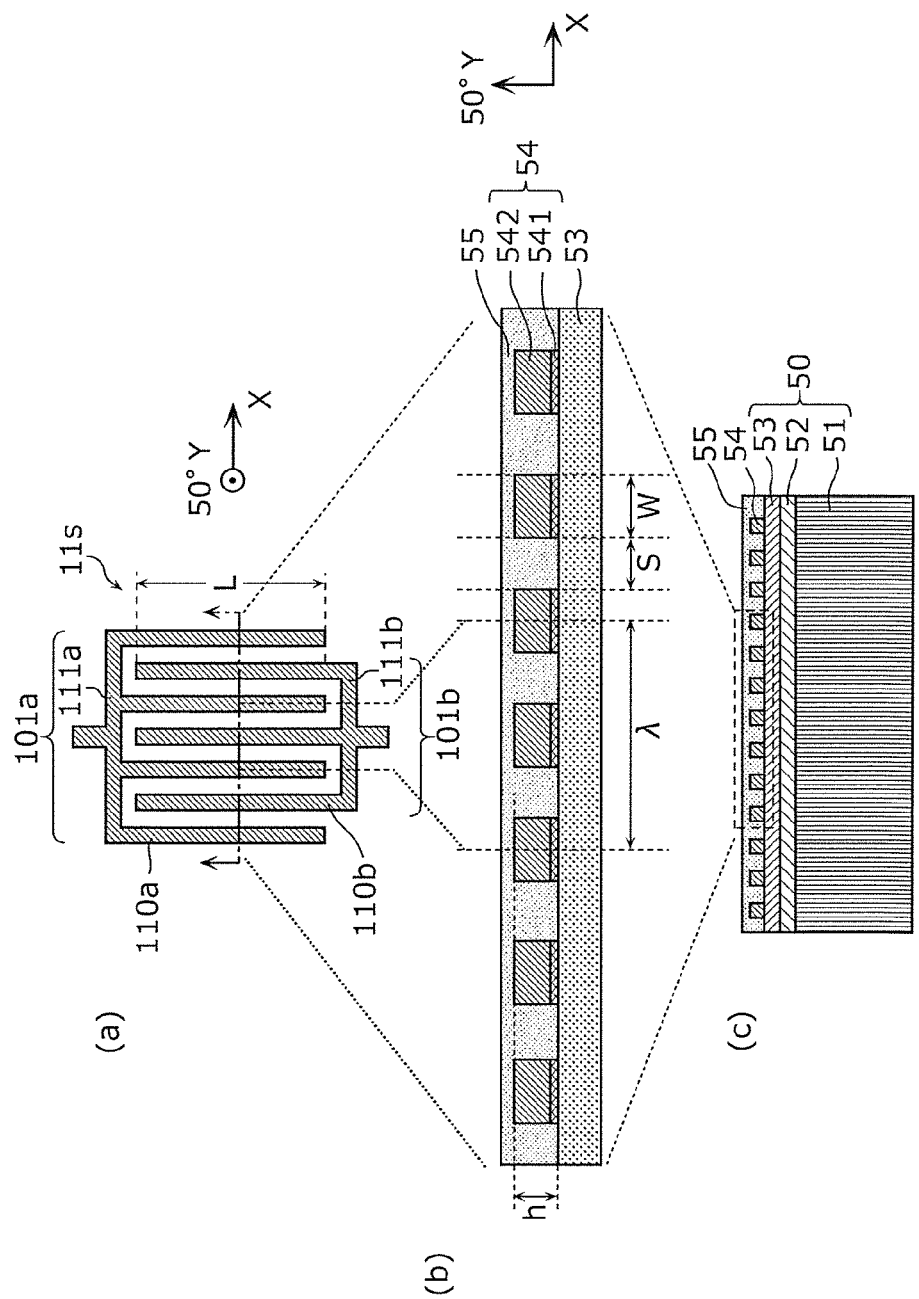
FIG. 3 illustrates a schematic plan view and schematic sectional views of an example of a resonator according to the first preferred embodiment of the present invention.

FIG. 3 at (a) illustrates a schematic plan view of an example of the elastic wave resonator according to the present preferred embodiment, and FIG. 3 at (b) and (c) illustrates sectional views thereof along a one-dot chain line illustrated at (a). Among the series arm resonators and the parallel arm resonators that are included in the transmission-side filter 10 and the reception-side filter 20, the elastic wave resonator that is used as the series arm resonator 11s of the transmission-side filter 10 is illustrated in the schematic plan view and the schematic sectional views in FIG. 3. The series arm resonator 11s is illustrated in FIG. 3 to describe a typical structure of each resonator, and the number and length of electrode fingers that are included in electrodes are not limited thereto.

The series arm resonator 11s includes a piezoelectric substrate 50 and an interdigital transducer electrode including of a pair of comb-shaped electrodes 101a and 101b.

As illustrated in FIG. 3 at (a), a pair of comb-shaped electrodes 101a and 101b that face each other are provided on the piezoelectric substrate 50. The comb-shaped electrode 101a includes electrode fingers 110a that are parallel or substantially parallel with each other, and a busbar electrode 111a that connects the electrode fingers 110a to each other. The comb-shaped electrode 101b includes electrode fingers 110b that are parallel or substantially parallel with each other, and a busbar electrode 111b that connects the electrode fingers 110b to each other. The electrode fingers 110a and 110b extend in a direction perpendicular or substantially perpendicular to the X-axis direction.

As illustrated in FIG. 3 at (b), an interdigital transducer electrode 54 that includes the electrode fingers 110a and 110b and the busbar electrodes 111a and 111b preferably a multilayer structure including a close-contact layer 541 and a main electrode layer 542, for example.

The close-contact layer 541 is a layer that improves adhesion between the piezoelectric substrate 50 and the main electrode layer 542, and an example of the material thereof is Ti. The film thickness of the close-contact layer 541 is preferably, for example, about 12 nm.

An example of the material of the main electrode layer 542 is Al that contains about 1% of Cu. The film thickness of the main electrode layer 542 is preferably, for example, about 162 nm.

A protective layer 55 covers the comb-shaped electrodes 101a and 101b. The protective layer 55 protects the main electrode layer 542 from external environment, adjusts frequency-temperature characteristics, and increases humidity resistance, and is preferably, for example, a film whose main component is silicon dioxide. The thickness of the protective layer 55 is preferably, for example, about 25 nm.

The materials of the close-contact layer 541, the main electrode layer 542, and the protective layer 55 are not limited to the above materials. The interdigital transducer electrode 54 may not have the multilayer structure described above. The interdigital transducer electrode 54 may be made of, for example, a metal such as Ti, Al, Cu, Pt, Au, Ag, or Pd, or an alloy thereof. The interdigital transducer electrode 54 may be made of multilayer bodies including the metal or alloy described above. The protective layer 55 may not be provided.

The multilayer structure of the piezoelectric substrate 50 will now be described.

As illustrated in FIG. 3 at (c), the piezoelectric substrate 50 includes a high acoustic velocity support substrate 51, a low acoustic velocity film 52, and a piezoelectric film 53. The high acoustic velocity support substrate 51, the low acoustic velocity film 52, and the piezoelectric film 53 are stacked in this order.

The piezoelectric film 53 is preferably made of a 50° Y-cut X-transmission LiTaO₃ piezoelectric single crystal or piezoelectric ceramics, for example, (lithium tantalate single crystal that is cut along a plane whose normal coincides with an axis that is rotated about 50° about the X-axis from the Y-axis or ceramics, and a surface acoustic wave is transmitted in the X-axis direction through the single crystal or ceramics). The thickness of the piezoelectric film 53 is preferably, for example, about 600 nm. The piezoelectric substrate 50 is not limited thereto, and, for example, the piezoelectric film 53 that is made of a 42 to 45° Y-cut X-transmission LiTaO₃ piezoelectric single crystal or piezoelectric ceramics may be used.

The high acoustic velocity support substrate 51 supports the low acoustic velocity film 52, the piezoelectric film 53, and the interdigital transducer electrode 54. A bulk wave is transmitted through the high acoustic velocity support substrate 51 at an acoustic velocity higher than an acoustic velocity at which an elastic wave, such as a surface acoustic wave or a boundary wave is transmitted through the piezoelectric film 53. The high acoustic velocity support substrate 51 confines a surface acoustic wave in a portion at which the piezoelectric film 53 and the low acoustic velocity film 52 are stacked and prevents the surface acoustic wave from leaking downward from the high acoustic velocity support substrate 51. An example of the high acoustic velocity support substrate 51 is a silicon substrate, and the thickness thereof is preferably, for example, about 200 μm.

A bulk wave is transmitted through the low acoustic velocity film 52 at an acoustic velocity lower than an acoustic velocity at which a bulk wave is transmitted through the piezoelectric film 53, and the low acoustic velocity film 52 is disposed between the piezoelectric film 53 and the high acoustic velocity support substrate 51. Because of this structure and an inherent property of an elastic wave whose energy concentrates on a low acoustic velocity medium, leakage of the energy of a surface acoustic wave to the outside of the interdigital transducer electrode is reduced or prevented. An example of a main component of the low acoustic velocity film 52 is silicon dioxide, and the thickness thereof is preferably, for example, about 670 nm.

With the multilayer structure of the piezoelectric substrate 50, a Q factor at a resonant frequency and an anti-resonant frequency is able to be greatly increased more than with an existing structure including a piezoelectric substrate in a single layer. That is, an elastic wave resonator having a high Q factor is able to be obtained, and the use of the elastic wave resonator enables a filter having a low insertion loss to be obtained.

The high acoustic velocity support substrate 51 may have a multilayer structure including a support substrate and a high acoustic velocity film through which a bulk wave is transmitted at an acoustic velocity higher than an acoustic velocity at which an elastic wave such as a surface acoustic wave or a boundary wave is transmitted through the piezoelectric film 53. In this case, examples of the material of the support substrate may include sapphire, piezoelectric materials, such as lithium tantalate, lithium niobate, and crystal, ceramics such as alumina, magnesia, silicon nitride, aluminum nitride, silicon carbide, zirconia, cordierite, mullite, steatite, and forsterite, a dielectric such as glass, a semiconductor such as silicon and gallium nitride, and a resin. Examples of the material of the high acoustic velocity film may include aluminum nitride, aluminum oxide, silicon carbide, silicon nitride, silicon oxynitride, DLC, diamond, a medium whose main component is one of these materials, and a medium whose main component is a mixture of these materials.

In FIG. 3 at (a) and (b), $\lambda$ is the pitch of the electrode fingers 110a and 110b that are included in the comb-shaped electrodes 101a and 101b, L is the crossing width of the comb-shaped electrodes 101a and 101b, W is the width of each of the electrode fingers 110a and 110b, S is a distance between each electrode finger 110a and the corresponding electrode finger 110b, and h is the height of each of the comb-shaped electrodes 101a and 101b. Parameters that define the shape and size of the series arm resonator 11s are referred to as resonator parameters, examples of which include the pitch $\lambda$, the crossing width L, the width W of each electrode finger, the distance S between the electrode fingers, and the height h of each interdigital transducer electrode.

Table 1 below illustrates the number of the electrode fingers of the elastic wave resonators that are included in the transmission-side filter 10 and an average pitch between the electrode fingers that represents the average value of the pitches (interdigital transducer electrode finger pitches) between the electrode fingers of the interdigital transducer electrodes.

TABLE 1

| RESO-NATOR | NUMBER OF ELECTRODE FINGERS (NUMBER) | AVERAGE PITCH BETWEEN ELECTRODE FINGERS (μm) |
|---|---|---|
| 11s | 139 | 4.0843 |
| 12s1, 12s2 | 210 | 4.0650 |
| 13s1, 13s2 | 224 | 4.0298 |
| 14s1, 14s2 | 134 | 4.0688 |
| 11p | 326 | 4.2752 |
| 12p | 110 | 4.2392 |
| 13p | 210 | 4.2550 |

The reception-side filter 20 (FIG. 2) is an elastic wave filter circuit that includes the elastic wave resonators, and includes series arm resonators 21s and 22s, parallel arm resonators 21p and 22p, and a longitudinally-coupled resonator 23L. The longitudinally-coupled resonator 23L includes longitudinally coupled resonators 23LI and 23L2 that are connected in parallel. Each of the longitudinally-coupled resonators 23LI and 23L2 preferably includes five elastic wave resonators 211 to 215 (FIG. 4), for example, that are disposed in the direction in which the elastic wave is transmitted. With this structure, the reception-side filter 20 is preferably used for, for example, a reception filter (reception (second frequency) band of about 925 MHz to about 960 MHz) in Band8 of the LIE standard. Each of the series arm resonators 21s and 22s, the parallel arm resonators 21p and 22p, and the elastic wave resonators 211 to 215 that are included in the longitudinally-coupled resonator 23L includes interdigital transducer electrodes that are provided on the piezoelectric substrate. That is, the reception-side filter 20 is preferably a surface acoustic wave filter, for example, that includes the interdigital transducer electrodes that are provided on the piezoelectric substrate.

Figure 4:
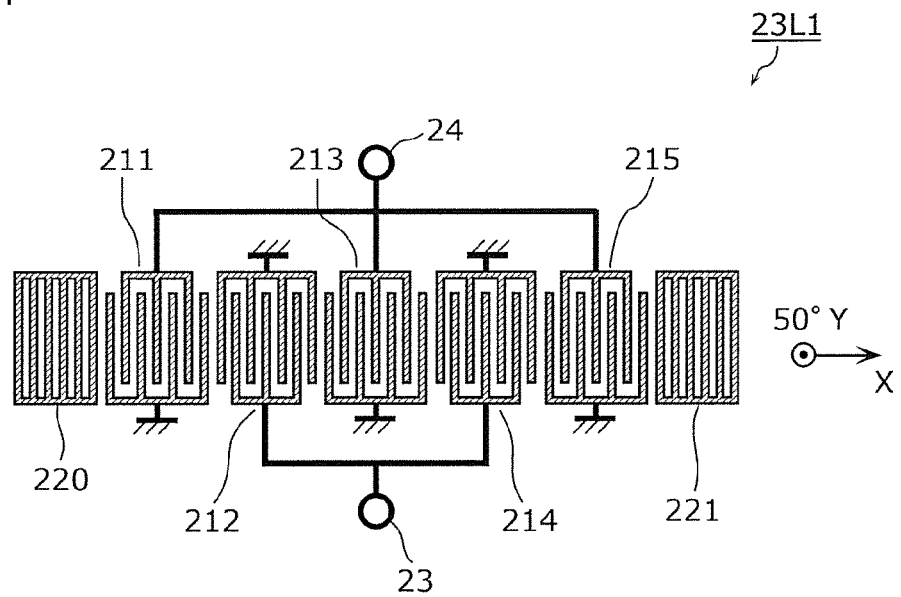
FIG. 4 is a schematic plan view of electrodes of a longitudinally-coupled surface acoustic wave filter according to the first preferred embodiment of the present invention.

FIG. 4 is a schematic plan view of the electrodes of the longitudinally-coupled resonator 23L1 according to the present preferred embodiment.

As illustrated in FIG. 4, the longitudinally-coupled resonator 23L1 includes the elastic wave resonators 211 to 215, reflectors 220 and 221, an input port 23, and an output port 24.

Each of the elastic wave resonators 211 to 215 includes a pair of the interdigital transducer electrodes that face each other. The elastic wave resonator 213 is interposed between the elastic wave resonators 212 and 214 in the direction (X-axis direction) in which the elastic wave is transmitted. The elastic wave resonators 212 to 214 are interposed between the elastic wave resonators 211 and 215 in the direction (X-axis direction) in which the elastic wave is transmitted. The elastic wave resonators 211 to 215 are interposed between the reflectors 220 and 221 in the direction (X-axis direction) in which the elastic wave is transmitted. The elastic wave resonators 212 and 214 are connected in parallel between the input port 23 and a reference terminal. The elastic wave resonators 211, 213 and 215 are connected in parallel between the output port 24 and the reference terminal.

Table 2 and Table 3 illustrate the number of the electrode fingers of the elastic wave resonators that are included in the reception-side filter 20, the pitches between the electrode fingers of the interdigital transducer electrodes, and the average pitch between the electrode fingers. Table 2 illustrates the number of the electrode fingers of the elastic wave resonators of the longitudinally-coupled resonators 23L1 and 23L2, the pitches between the electrode fingers of the interdigital transducer electrodes, and the average pitch between the electrode fingers. Table 3 illustrates the number of the electrode fingers and the average pitch between the electrode fingers of the elastic wave resonators of the series arm resonators and the parallel arm resonators other than the longitudinally-coupled resonators 23L1 and 23L2. The average pitch between the electrode fingers in the longitudinally-coupled resonators is calculated as: (the sum of the pitches between the electrode fingers)/(the number of the electrode fingers) of the interdigital transducer electrodes of the elastic wave resonators other than the reflectors when the number of the electrode fingers is an even number, and is calculated as: (the sum of the pitches between the electrode fingers)/{(the number of the electrode fingers−1)} when the number of the electrode fingers is an odd number.

TABLE 2

| RESO-NATOR | NUMBER OF ELECTRODE FINGERS (NUMBER) | PITCH BETWEEN ELECTRODE FINGERS (μm) | AVERAGE PITCH BETWEEN ELECTRODE FINGERS (μm) |
|---|---|---|---|
| 211 | 39 | 4.4157 | 4.0042 |
|  | 5 | 3.7046 |  |
| 212 | 5 | 3.4631 |  |
|  | 7 | 4.0237 |  |
|  | 11 | 3.8134 |  |
| 213 | 3 | 3.5963 |  |
|  | 11 | 3.8739 |  |
|  | 3 | 3.6021 |  |
| 214 | 11 | 3.8250 |  |
|  | 7 | 3.9708 |  |
|  | 5 | 3.7201 |  |
| 215 | 5 | 3.6645 |  |
|  | 23 | 3.9740 |  |

TABLE 3

| RESO-NATOR | NUMBER OF ELECTRODE FINGERS (NUMBER) | AVERAGE PITCH BETWEEN ELECTRODE FINGERS (μm) |
|---|---|---|
| 21s | 89 | 3.8136 |
| 22s | 76 | 3.8307 |
| 21p | 88 | 3.9832 |
| 22p | 92 | 4.0079 |

The number of the elastic wave resonators that are included in each of the longitudinally-coupled resonators 23L1 and 23L2 is not limited to five and may be appropriately determined in accordance with the bandpass characteristic of the reception-side filter 20.

The cancel circuit 30 includes the longitudinally coupled resonator 31. The longitudinally-coupled resonator 31 includes the three elastic wave resonators 31a, 31b, and 31c that are disposed in the direction in which the elastic wave is transmitted, and reflectors (not illustrated) between which the elastic wave resonators 31a, 31b, and 31c (FIG. 2) are interposed in the direction in which the elastic wave is transmitted.

The cancel circuit 30 may consist of the longitudinally-coupled resonator 31 or may include another circuit element other than the longitudinally-coupled resonator 31. For example, the multiplexer 1 according to the present preferred embodiment includes the cancel circuit 30 that consists of the longitudinally-coupled resonator 31.

Each of the elastic wave resonators 31a, 31b, and 31c includes two interdigital transducer electrodes that face each other and that are comb-shaped or substantially comb-shaped as in the elastic wave resonators 211 to 215 of the longitudinally-coupled resonator 23L1 described above. The elastic wave resonators 31a, 31b, and 31c are provided on the piezoelectric substrate. The elastic wave resonators 31a and 31c are connected to the node N and the reference terminal. The elastic wave resonator 31b is connected to the node M and the reference terminal.

The elastic wave resonators 31a, 31b, and 31c may be provided on a piezoelectric substrate on which the transmission-side filter 10, the reception-side filter 20, or both are provided. The size of the multiplexer 1 is able to be decreased when the longitudinally-coupled resonator 31 is provided on the piezoelectric substrate on which the transmission-side filter 10, the reception-side filter 20, or both are provided.

Table 4 illustrates the number of the electrode fingers of the elastic wave resonators that are included in the cancel circuit 30 in the first example, the pitches between the electrode fingers of the interdigital transducer electrodes, and the average pitch between the electrode fingers.

TABLE 4

| RESO-NATOR | NUMBER OF ELECTRODE FINGERS (NUMBER) | PITCH BETWEEN ELECTRODE FINGERS (μm) | AVERAGE PITCH BETWEEN ELECTRODE FINGERS (μm) |
|---|---|---|---|
| 31a | 3 | 3.6758 | 3.6832 |
|  | 3 | 3.5421 |  |
| 31b | 6 | 3.7806 |  |
|  | 15 | 3.7313 |  |
|  | 8 | 3.6023 |  |
| 31c | 3 | 3.6595 |  |
|  | 5 | 3.6542 |  |

The average pitch between the electrode fingers of the elastic wave resonators of the longitudinally-coupled resonator 31 that is included in the cancel circuit 30 is narrower than the average pitch between the electrode fingers of the elastic wave resonators that are included in the transmission-side filter 10 and the average pitch between the electrode fingers of the elastic wave resonators that are included in the reception-side filter 20. That is, the resonant frequency of the longitudinally-coupled resonator 31 is higher than frequencies in the pass band of the transmission-side filter 10 and the pass band of the reception-side filter 20, and accordingly, the attenuation band of the longitudinally-coupled resonator 31 is in the pass band of the transmission-side filter 10 and the pass band of the reception-side filter 20.

The number of the elastic wave resonators that are included in the longitudinally-coupled resonator 31 is not limited to three and may be appropriately determined in accordance with the bandpass characteristic that the cancel circuit 30 is required to have.

The high-frequency transmission characteristics of the multiplexer 1 according to the present preferred embodiment will be compared with the high-frequency transmission characteristics of multiplexers in comparative examples and described below.

The structure of the multiplexer in each comparative example will now be described.

Figure 5:
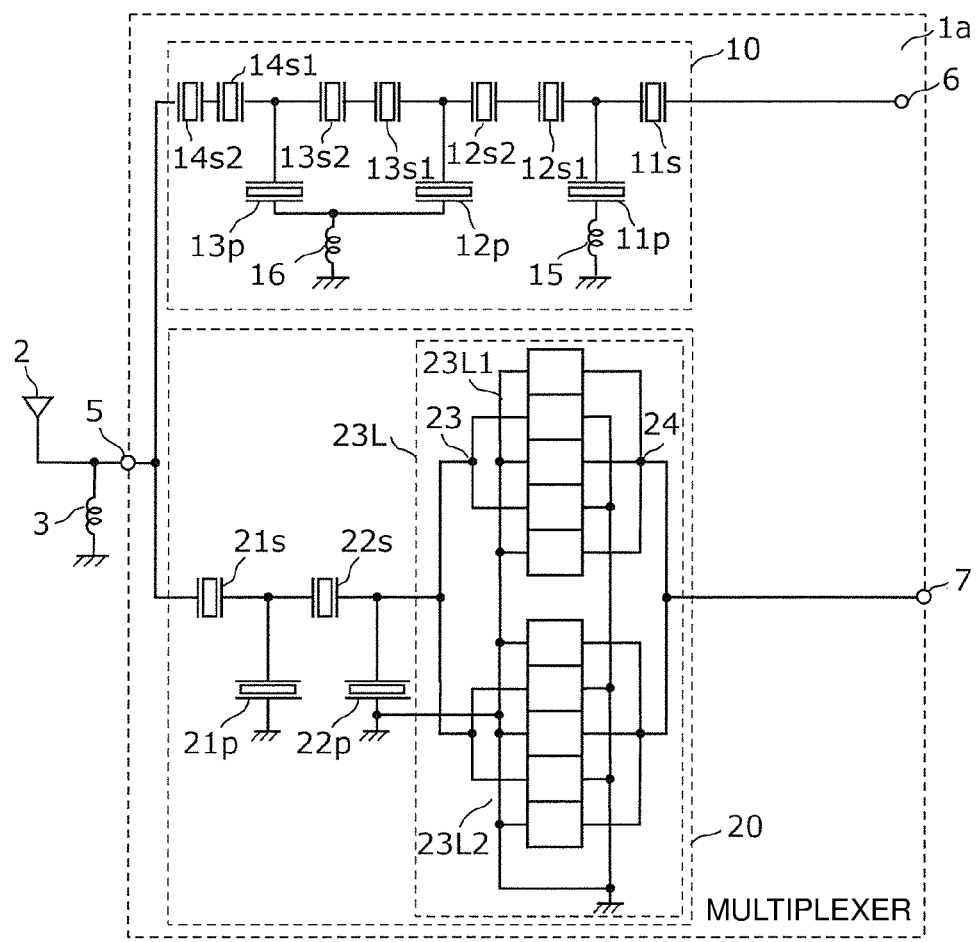
FIG. 5 is a specific circuit diagram of a multiplexer in a first comparative example.

FIG. 5 is a circuit diagram of a multiplexer 1a in a first comparative example. The multiplexer 1a illustrated in FIG. 5 includes the transmission-side filter 10, the reception-side filter 20, the common connection terminal 5, the transmission-side terminal 6, and the reception-side terminal 7. The transmission-side filter 10 and the reception-side filter 20 have the same or substantially the same structure as the transmission-side filter 10 and the reception-side filter 20 of the multiplexer 1 in the first example. That is, the multiplexer 1a differs from the multiplexer 1 in the first example in that the multiplexer 1a does not include the cancel circuit 30.

A multiplexer in a second comparative example includes the transmission-side filter 10, the reception-side filter 20, a cancel circuit, the common connection terminal 5, the transmission-side terminal 6, and the reception-side terminal 7 as in the multiplexer 1 in the first example. The transmission-side filter 10 and the reception-side filter 20 have the same or substantially the same structure as the transmission-side filter 10 and the reception-side filter 20 of the multiplexer 1 in the first example. The structure of the cancel circuit is similar to that of the cancel circuit 30 of the multiplexer 1 in the first example. However, the pitches between the electrode fingers of the interdigital transducer electrodes of the elastic wave resonators differ from the pitches between the electrode fingers of the interdigital transducer electrodes of the elastic wave resonators of the cancel circuit 30.

Table 5 illustrates the number of the electrode fingers, the pitches between the electrode fingers of the interdigital transducer electrodes, and the average pitch between the electrode fingers, of the elastic wave resonators that are included in the cancel circuit of the multiplexer in the second comparative example.

TABLE 5

| RESO-NATOR | NUMBER OF ELECTRODE FINGERS (NUMBER) | PITCH BETWEEN ELECTRODE FINGERS (μm) | AVERAGE PITCH BETWEEN ELECTRODE FINGERS (μm) |
|---|---|---|---|
| 31a | 3 | 3.8375 | 3.8956 |
|  | 3 | 3.8271 |  |
| 31b | 6 | 4.0102 |  |
|  | 15 | 3.9713 |  |
|  | 8 | 3.7751 |  |
| 31c | 3 | 3.8073 |  |
|  | 5 | 3.8526 |  |

The average pitch between the electrode fingers of the longitudinally-coupled resonator that is included in the cancel circuit of the multiplexer in the second comparative example is larger than the average pitch between the electrode fingers of the series arm resonators 21s and 22s that are included in the reception-side filter 20. Consequently, the longitudinally-coupled resonator that is included in the cancel circuit has a resonant-mode resonant frequency that is in the pass band of the reception-side filter 20, and accordingly, the pass band of the longitudinally-coupled resonator that is included in the cancel circuit is in the pass band of the reception-side filter 20. The resonant-mode resonant frequency is higher than frequencies in the pass band of the transmission-side filter 10, and accordingly, the attenuation band of the longitudinally-coupled resonator that is included in the cancel circuit is in the pass band of the transmission-side filter 10.

The high-frequency transmission characteristics of the multiplexer 1 in the first example will be compared with the high-frequency transmission characteristics of the multiplexers in the first comparative example and the second comparative example and described below.

Figure 6A:
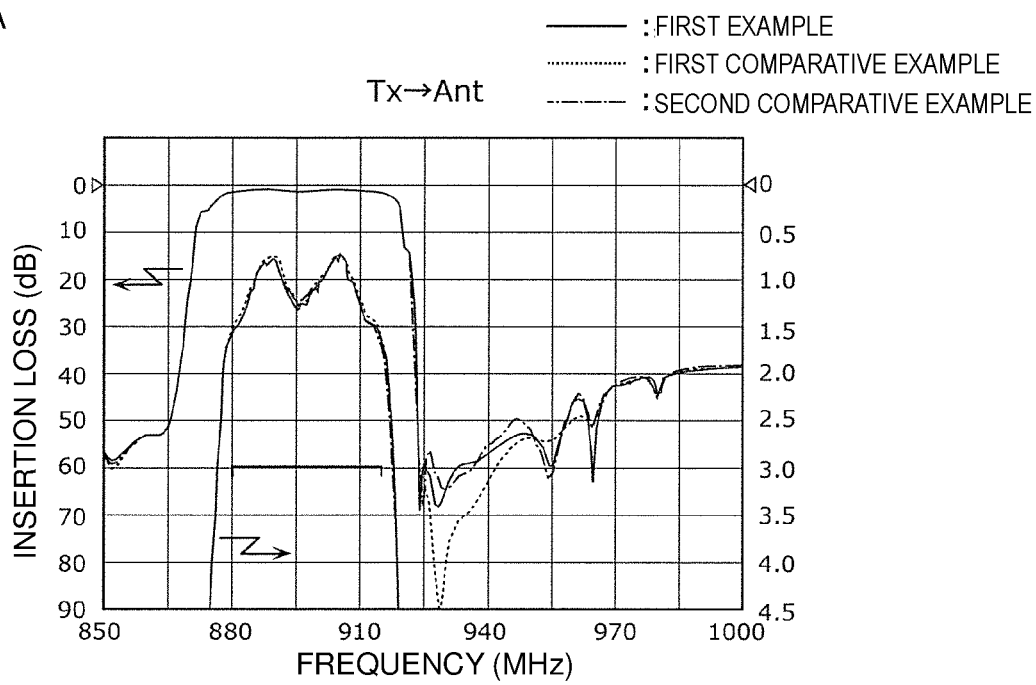
FIG. 6A illustrates a comparison of the bandpass characteristics of a transmission-side filter among the first example of a preferred embodiment of the present invention, the first comparative example, and a second comparative example.
Figure 6B:
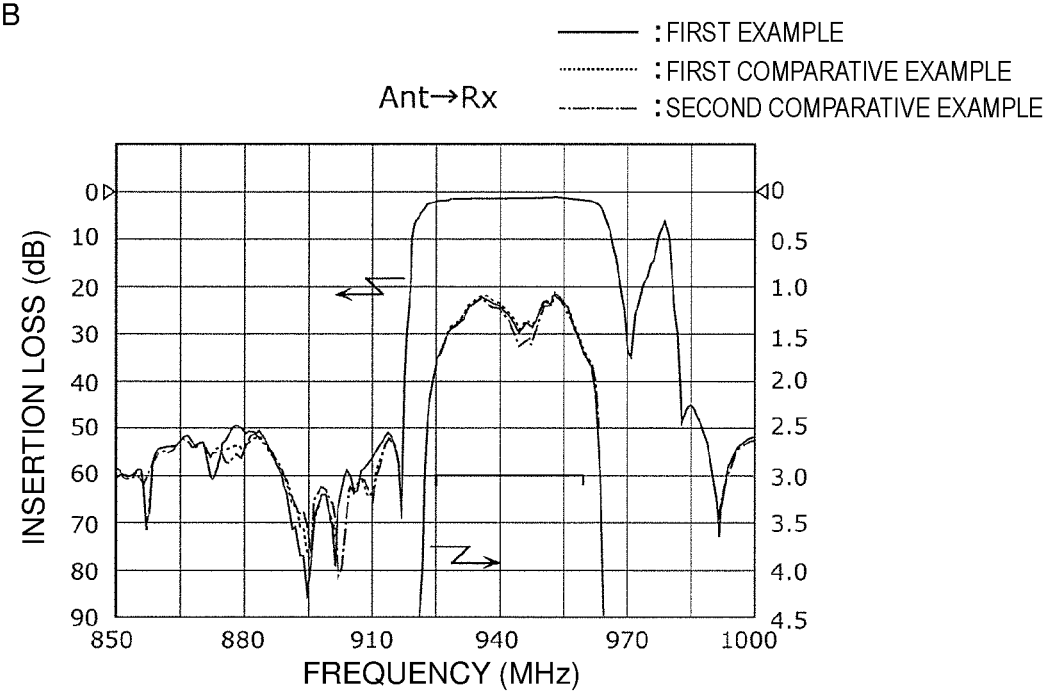
FIG. 6B illustrates a comparison of the bandpass characteristic of a reception-side filter among the first example of a preferred embodiment of the present invention, the first comparative example, and the second comparative example.
Figure 6C:
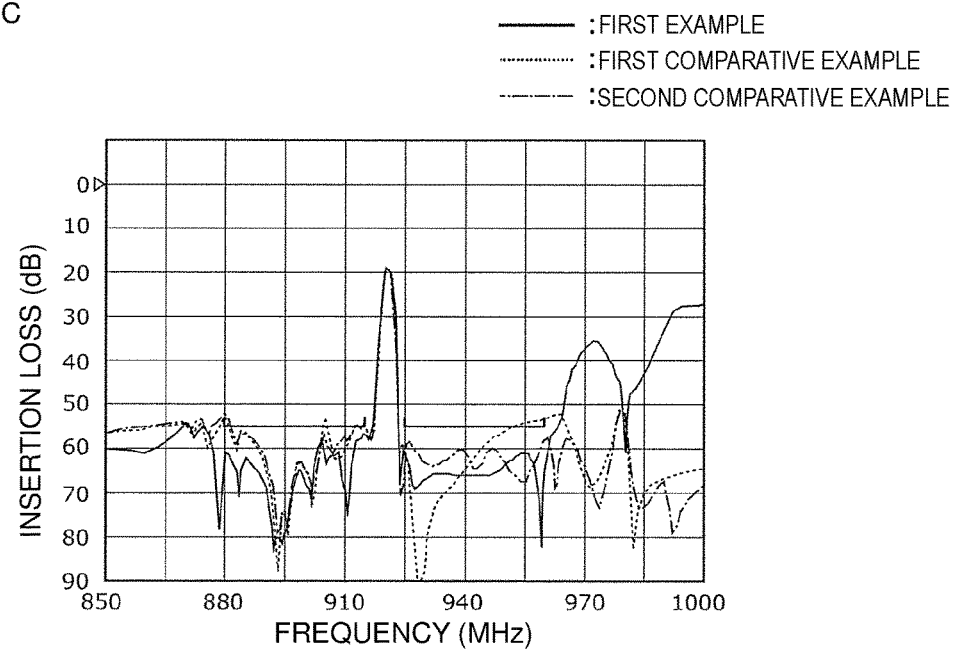
FIG. 6C illustrates a comparison of the isolation characteristics of the multiplexer among the first example of a preferred embodiment of the present invention, the first comparative example, and the second comparative example.

FIG. 6A illustrates a comparison of the bandpass characteristic of the transmission-side filter 10 among the first example, the first comparative example, and the second comparative example. FIG. 6B illustrates a comparison of the bandpass characteristic of the reception-side filter 20 among the first example, the first comparative example, and the second comparative example. FIG. 6C illustrates a comparison of the isolation characteristics of the multiplexer among the first example, the first comparative example, and the second comparative example. In FIGS. 6A to 6C, the characteristics in the first example are illustrated by a solid line, the characteristics in the first comparative example is illustrated in a dashed line, and the characteristics in the second comparative example is illustrated in a one-dot chain line.

In the first example, frequencies in the pass band (first frequency band) of the transmission-side filter 10 are lower than frequencies in the pass band (second frequency band) of the reception-side filter 20, and the resonant response frequency of the cancel circuit 30 at which the insertion loss reaches the minimum point is at a high-pass edge in the second frequency band.

As illustrated in FIG. 6A, the characteristics of the insertion loss of the transmission-side filter 10 of the multiplexer 1 in the first example are the same or substantially the same as with the multiplexers in the first comparative example and the second comparative example. As illustrated in FIG. 6B, the characteristics of the insertion loss of the reception-side filter 20 of the multiplexer 1 in the first example are the same or substantially the same as with the multiplexers in the first comparative example and the second comparative example. That is, the insertion loss of the transmission-side filter 10 and the reception-side filter 20 of the multiplexer 1 that includes the cancel circuit 30 is not degraded as compared to the multiplexer that includes no cancel circuit and the multiplexer that has wider pitches between the electrode fingers of the interdigital transducer electrodes of the elastic wave resonators of the cancel circuit.

As illustrated in FIG. 6C, the isolation characteristics between the transmission-side filter 10 and the reception-side filter 20 in a transmission band (about 880 MHz to about 915 MHz) are as follows: about 53.0 dB in the case of the multiplexer in the first comparative example, about 53.0 dB in the case of the multiplexer in the second comparative example, and about 56.7 dB in the case of the multiplexer 1 in the first example. The isolation characteristics between the transmission-side filter 10 and the reception-side filter 20 in a reception band (about 925 MHz to about 960 MHz) are as follows: about 53.0 dB in the case of the multiplexer in the first comparative example, about 57.6 dB in the case of the multiplexer in the second comparative example, and about 60.6 dB in the case of the multiplexer 1 in the first example.

Accordingly, the isolation characteristics between the transmission-side filter 10 and the reception-side filter 20 of the multiplexer 1 in the first example in both of the transmission band and the reception band are better than those in the first comparative example and the second comparative example.

Figure 7:
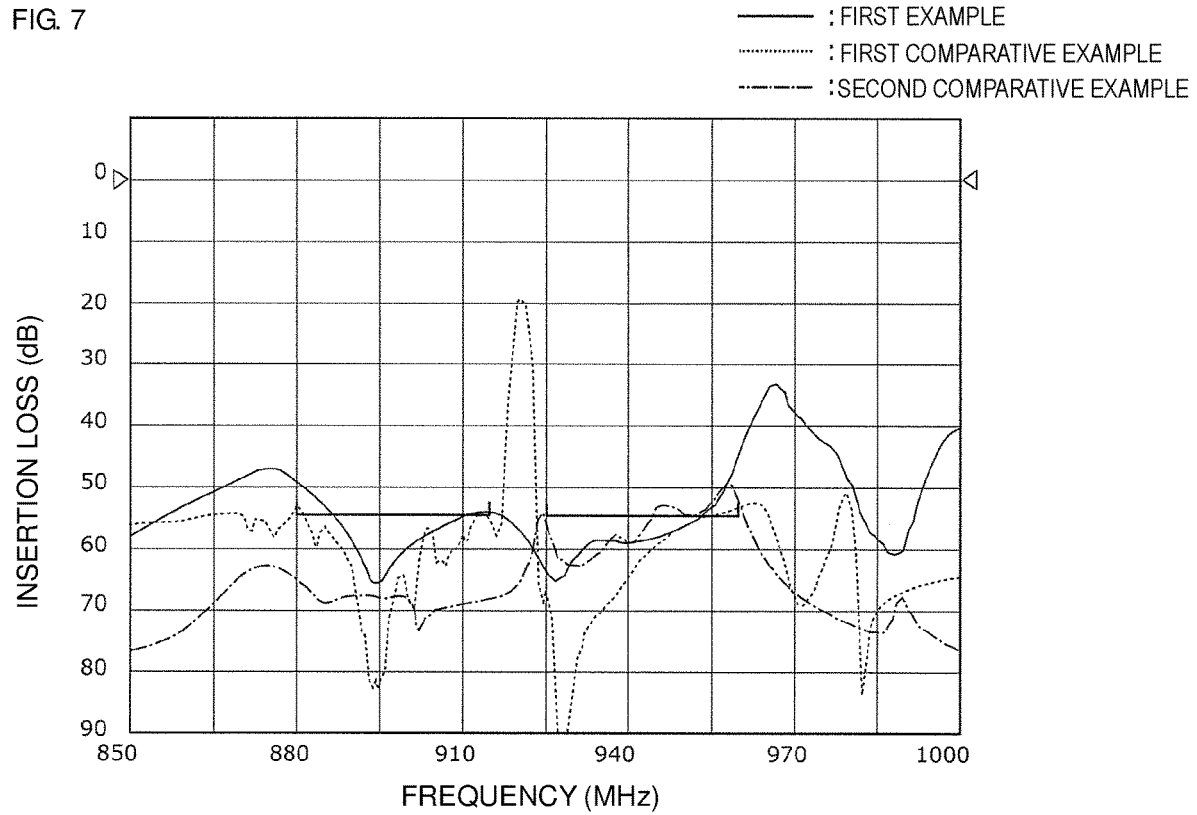
FIG. 7 illustrates the isolation characteristics of the multiplexer in the first comparative example and the amplitude characteristics of a longitudinally-coupled resonator alone in the first example of a preferred embodiment of the present invention and a longitudinally-coupled resonator alone in the second comparative example.

FIG. 7 illustrates the isolation characteristics of the multiplexer in the first comparative example and the amplitude characteristics of the longitudinally-coupled resonator alone in the first example and the longitudinally-coupled resonator alone in the second comparative example. In FIG. 7, the isolation characteristics of the multiplexer in the first comparative example are illustrated by a dashed line, the amplitude characteristics of the longitudinally-coupled resonator 31 alone in the first example are illustrated in a solid line, and the amplitude characteristics of the longitudinally-coupled resonator alone in the second comparative example are illustrated in a one-dot chain line.

As illustrated in FIG. 7, the amplitude characteristics of the longitudinally-coupled resonator 31 alone in the first example are the same or substantially the same as the isolation characteristics in the first comparative example. Accordingly, isolation between the transmission-side filter 10 and the reception-side filter 20 of the multiplexer 1 that includes the cancel circuit 30 is improved in both of the transmission band and the reception band.

The amplitude characteristics of the longitudinally-coupled resonator alone in the second comparative example are the same or substantially the same as the amplitude characteristics in the reception band but are different from the amplitude characteristics in the transmission band. Accordingly, the transmission-side filter 10 and the reception-side filter 20 of the multiplexer in the second comparative example, which includes the cancel circuit that consists of the longitudinally-coupled resonator, have improved isolation characteristics only in the reception band.

The pass band of the longitudinally-coupled resonator of the multiplexer in the second comparative example is in the reception band, and accordingly, the transmission band corresponds to the attenuation band of the longitudinally-coupled resonator. There is a large difference in the amplitude characteristics between the pass band and the attenuation band. Accordingly, when the amplitude characteristics in the transmission band or the amplitude in the reception band is adjusted to be the same or substantially the same by adjusting the resonator parameters of the longitudinally-coupled resonator, the amplitude characteristics in the other band are not the same or substantially the same. Accordingly, it is difficult for the multiplexer with the structure of the longitudinally-coupled resonator in the second comparative example to improve the isolation characteristics in both of the transmission band and the reception band. With the structure of the longitudinally-coupled resonator in the second comparative example, the difference in the amplitude characteristics is able to be reduced or eliminated by adjusting the transmission band and the reception band to be in the pass band of the longitudinally-coupled resonator. However, this is difficult for the following reasons: (1) a material having a large electromechanical coupling coefficient is needed, and (2) the electromechanical coupling coefficient is determined solely by a filter characteristic.

In contrast, in the multiplexer 1 in the first example, the transmission band and the reception band are adjusted to be in the attenuation band of the longitudinally-coupled resonator 31. Accordingly, the difference in the amplitude characteristics of the multiplexer 1 between the transmission band and the reception band is reduced or eliminated, and isolation between the transmission-side filter 10 and the reception-side filter 20 is improved in both of the transmission band and the reception band. In addition, the amplitude characteristics of the transmission-side filter 10 and the reception-side filter 20 are able to be more successfully matched with each other in a manner in which the frequency of an attenuation pole in the attenuation band of the longitudinally-coupled resonator 31 is matched with the frequencies of attenuation poles of the transmission-side filter 10 and the reception-side filter 20. In FIG. 6C, the isolation characteristics of the multiplexer 1 in the first example is improved to a greater extent than the isolation characteristics of the multiplexer in the second comparative example in the reception band.

When the average pitch between the electrode fingers of the longitudinally-coupled resonator 31 is narrower than the average pitch between the electrode fingers of the resonators that are included in the transmission-side filter 10 and the average pitch in the reception-side filter 20, the attenuation band of the longitudinally-coupled resonator 31 exists in both of the transmission band and the reception band. Accordingly, the isolation characteristics in both of the transmission band and the reception band are able to be improved. In the case of the cancel circuit 30 in the first example, a peak frequency of the amplitude characteristics of the longitudinally-coupled resonator 31 is more preferably higher than frequencies in the transmission band and the reception band. In this case, the entire transmission band and the entire reception band are in the attenuation band of the longitudinally-coupled resonator 31, and the isolation characteristics are further improved.

The resonant-mode resonant frequency of the longitudinally-coupled resonator 31 of the multiplexer 1 in the first example is further deviates from the transmission band than in the case of the first comparative example, and accordingly, the multiplexer 1 has better electric power handling capability. Since the resonant-mode resonant frequency is higher than the frequencies in the transmission band and the reception band, the frequency of a bulk wave of the longitudinally-coupled resonator 31 is not in the pass band, and losses in the transmission band and the reception band are scarcely increased.

Even when the cancel circuit 30 consists of the longitudinally-coupled resonator 31 as in the multiplexer 1 in the first example, the amplitude characteristics in both of the transmission band and the reception band are able to be matched. Consequently, there is no need for an additional capacitance element to adjust the amplitude, and a smaller element is able to be obtained accordingly.

In the multiplexer 1 according to the present preferred embodiment, the average pitch between the electrode fingers of the interdigital transducer electrodes of the resonators that are included in the longitudinally-coupled resonator of the cancel circuit is narrower than the average pitch between the electrode fingers of the interdigital transducer electrodes of the resonators that are included in the transmission-side filter and in the reception-side filter. Accordingly, the attenuation band of the longitudinally-coupled resonator of the cancel circuit exists in both of the transmission band and the reception band. This enables the difference in the amplitude characteristics of the multiplexer between the transmission band and the reception band to be greatly reduced or eliminated. Accordingly, the cancel circuit more successfully cancels out the component in the predetermined frequency band that flows along the first path that connects the common connection terminal and the transmission-side terminal to each other by using the cancel component that is in anti-phase. Consequently, the isolation characteristics in both of the transmission band and the reception band are improved.

Second Preferred Embodiment

Figure 8:
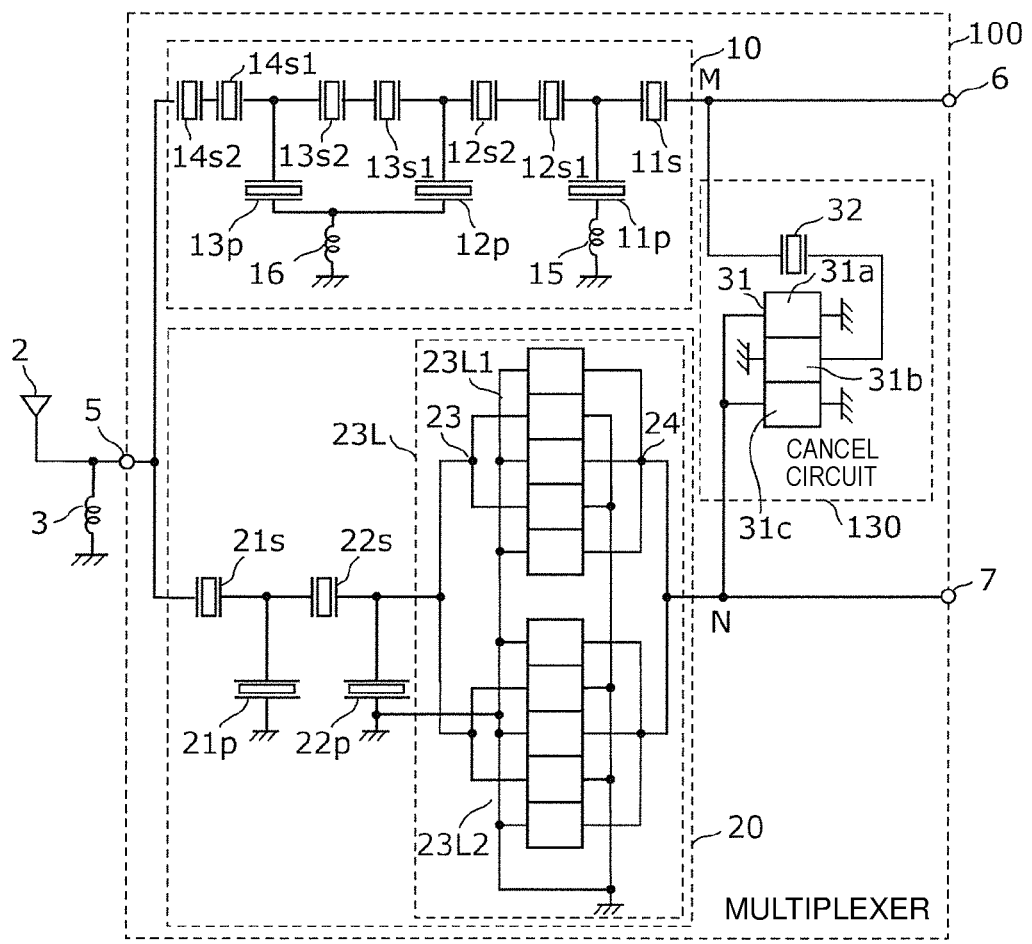
FIG. 8 is a circuit diagram of a multiplexer according to a second preferred embodiment of the present invention.

A multiplexer 100 according to a second preferred embodiment of the present invention will now be described. FIG. 8 is a circuit diagram of the multiplexer 100 according to the present preferred embodiment.

The multiplexer 100 according to the present preferred embodiment differs from the multiplexer 1 according to the first preferred embodiment in that the cancel circuit includes the longitudinally-coupled resonator and a capacitance element. The other structure is the same or substantially the same as in the first example.

The multiplexer 100 in a second example will be described as an example of a circuit structure of the multiplexer 100 according to the present preferred embodiment.

As illustrated in FIG. 8, the multiplexer 100 includes the transmission-side filter 10, the reception-side filter 20, and a cancel circuit 130. The structure of the transmission-side filter 10 and the reception-side filter 20 is the same or substantially the same as the structure of the transmission-side filter 10 and the reception-side filter 20 that are described according to the first preferred embodiment, and a description thereof is omitted. Also, in the present preferred embodiment, frequencies in the pass band of the reception-side filter 20 are preferably higher than frequencies in the pass band of the transmission-side filter 10.

The cancel circuit 130 includes the longitudinally-coupled resonator 31 and a capacitance element 32. The longitudinally-coupled resonator 31 generates the cancel component that is in anti-phase with the component in the predetermined frequency band that flows along the first path that connects the common connection terminal 5 and the transmission-side terminal 6 to each other. The structure of the longitudinally-coupled resonator 31 is the same or substantially the same as the structure of the longitudinally-coupled resonator 31 that is described according to the first preferred embodiment, and a description thereof is omitted.

The capacitance element 32 adjusts the amplitude and phase of the cancel component. The capacitance element 32 is connected at one end thereof to the node M and is connected at the other end thereof to the elastic wave resonator 31a of the longitudinally-coupled resonator 31. That is, the capacitance element 32 is connected in series with the longitudinally-coupled resonator 31 between the longitudinally-coupled resonator 31 and the transmission-side filter 10. The one end of the capacitance element 32 may be connected to the transmission-side terminal 6, instead of the node M.

The capacitance element 32 is preferably an elastic wave resonator, for example. That is, the capacitance element 32 is a series arm resonator that is connected in series with the longitudinally-coupled resonator 31. The resonant frequency of the capacitance element 32 is preferably near, for example, about 954 MHz, which is a frequency in the pass band (second frequency band) of the reception-side filter 20. The anti-resonant frequency of the capacitance element 32 is preferably about 987 MHz, which is out of the reception band. This enables the isolation characteristics in the reception band to be improved because the amplitude characteristics of the cancel circuit 130 are closer to the amplitude characteristics of the multiplexer 100 in the reception band. In addition, the electric power handling capability of the series arm resonator is improved.

For example, the capacitance element 32 includes interdigital transducer electrodes that are preferably provided in the piezoelectric substrate on which the longitudinally-coupled resonator 31 is provided. The size of the multiplexer 100 is able to be decreased in a manner in which the longitudinally-coupled resonator 31 and the capacitance element 32 are provided on the piezoelectric substrate.

In FIG. 8, the capacitance element 32 is illustrated as an elastic wave resonator. However, this means that the capacitance element 32 may be an element that is capacitive such as the elastic wave resonator (for example, a one-port resonator), and the capacitance element 32 is not limited to the elastic wave resonator and may be another capacitance element.

To provide impedance matching between the cancel circuit and the filter circuit with which the cancel circuit is connected in parallel, it is typically thought that capacitance elements that are connected in series with the cancel circuit are distributed to both ends of the longitudinally-coupled resonator.

However, in the multiplexer 100 according to the present preferred embodiment, the capacitance element 32 of the cancel circuit 130 is not disposed on the node-N side of the longitudinally-coupled resonator 31 but is disposed only on the node-M side of the longitudinally-coupled resonator 31. In this case, it is only necessary for the capacitance element 32 disposed only on the node-M side of the longitudinally-coupled resonator 31 to have an electrostatic capacitance smaller than that of one of two capacitance elements that are disposed in series in order to ensure the same electrostatic capacitance as in the case in which the two capacitance elements are distributed to both ends of the longitudinally-coupled resonator (the case in which the two capacitance elements are disposed in series). Accordingly, the size of the cancel circuit 130 is able to be smaller than that of a cancel circuit that includes the two capacitance elements.

An impedance when the cancel circuit 130 is viewed from the node M is able to be higher than an impedance when the cancel circuit 130 is viewed from the node N in a manner in which the capacitance element 32 is disposed only on the node-M side of the longitudinally-coupled resonator 31 of the cancel circuit, which needs to have a certain electrostatic capacitance. This reduces or prevents leakage of a signal in the first frequency band from the transmission-side filter 10 toward the reception-side filter 20.

Figure 9A:
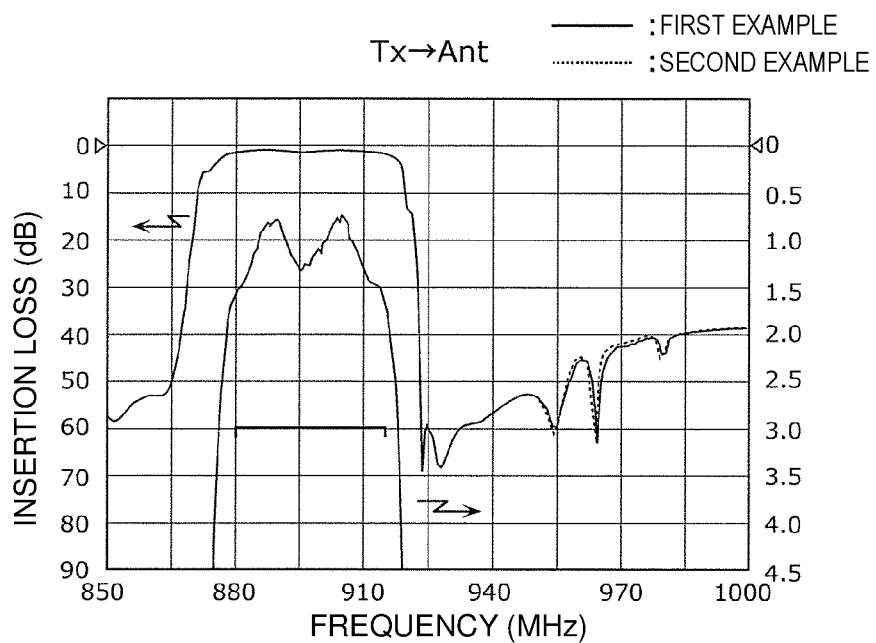
FIG. 9A illustrates a comparison of the bandpass characteristic of the transmission-side filter between the first example of a preferred embodiment of the present invention and a second example of a preferred embodiment of the present invention.
Figure 9B:
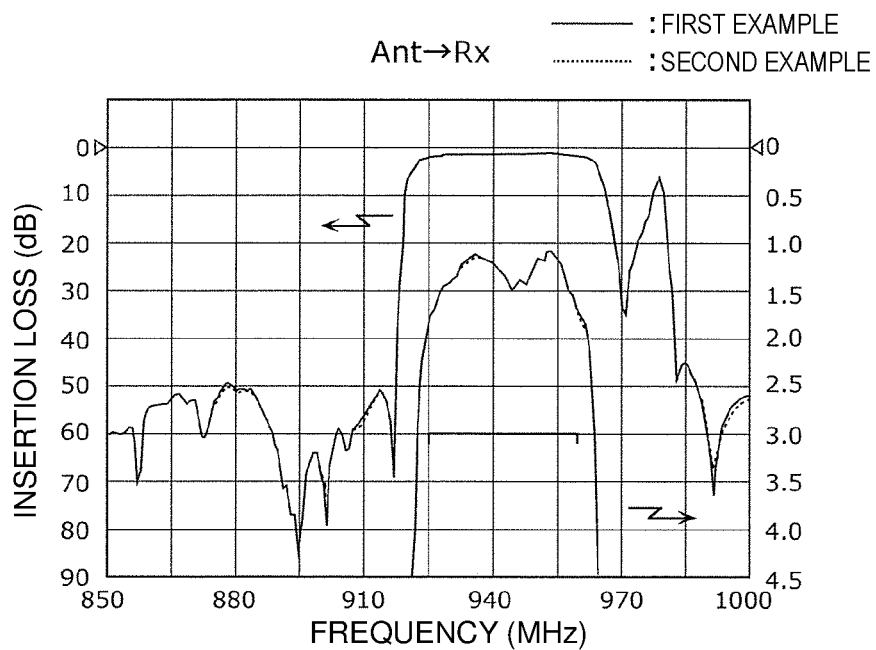
FIG. 9B illustrates a comparison of the bandpass characteristic of the reception-side filter between the first example of a preferred embodiment of the present invention and the second example of a preferred embodiment of the present invention.
Figure 9C:
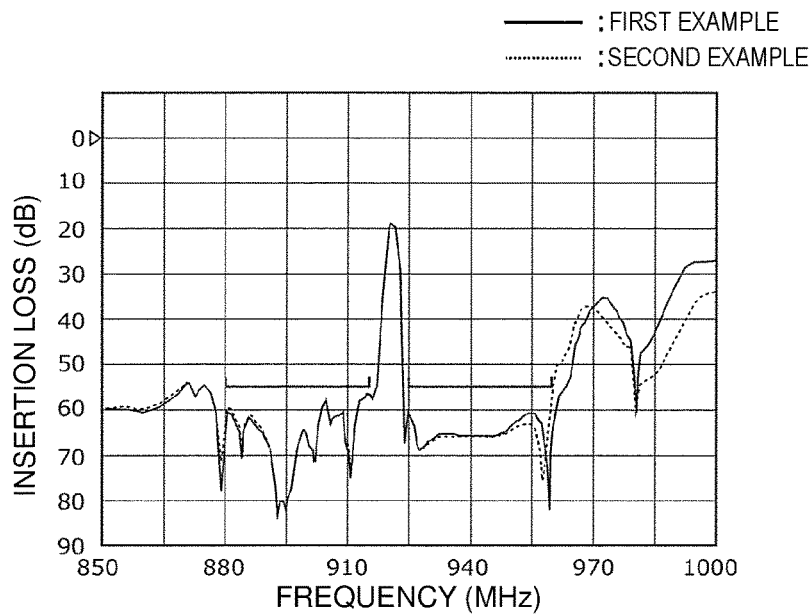
FIG. 9C illustrates comparison of the isolation characteristics of the multiplexer between the first example of a preferred embodiment of the present invention and the second example of a preferred embodiment of the present invention.

FIG. 9A illustrates a comparison of the bandpass characteristic of the transmission-side filter 10 between the first example and the second example. FIG. 9B illustrates a comparison of the bandpass characteristic of the reception-side filter 20 between the first example and the second example. FIG. 9C illustrates a comparison of the isolation characteristics between the multiplexer 1 in the first example and the multiplexer 100 in the second example. In FIG. 9A to FIG. 9C, the characteristics in the first example are illustrated by a solid line, and the characteristics in the second example are illustrated by a dashed line.

As illustrated in FIG. 9A, the characteristics of the insertion loss of the transmission-side filter 10 of the multiplexer 100 in the second example are the same or substantially the same as with the multiplexer 1 in the first example. As illustrated in FIG. 9B, the characteristics of the insertion loss of the reception-side filter 20 of the multiplexer 100 in the second example are the same or substantially the same as with the multiplexer 1 in the first example. That is, the insertion loss of the transmission-side filter 10 and the reception-side filter 20 of the multiplexer 100 that includes the cancel circuit 130 is not degraded as compared to the multiplexer 1 that includes the cancel circuit 30.

As illustrated in FIG. 9C, the isolation characteristics between the transmission-side filter 10 and the reception-side filter 20 of the multiplexer 100 in the second example in the transmission band (about 880 MHz to about 915 MHz) are the same or substantially the same as with the multiplexer 1 in the first example. The isolation characteristics between the transmission-side filter 10 and the reception-side filter 20 of the multiplexer 100 in the second example in a higher range of the reception band (about 925 MHz to about 960 MHz) are improved by about 2.5 dB compared to those of the multiplexer 1 in the first example.

Figure 10:
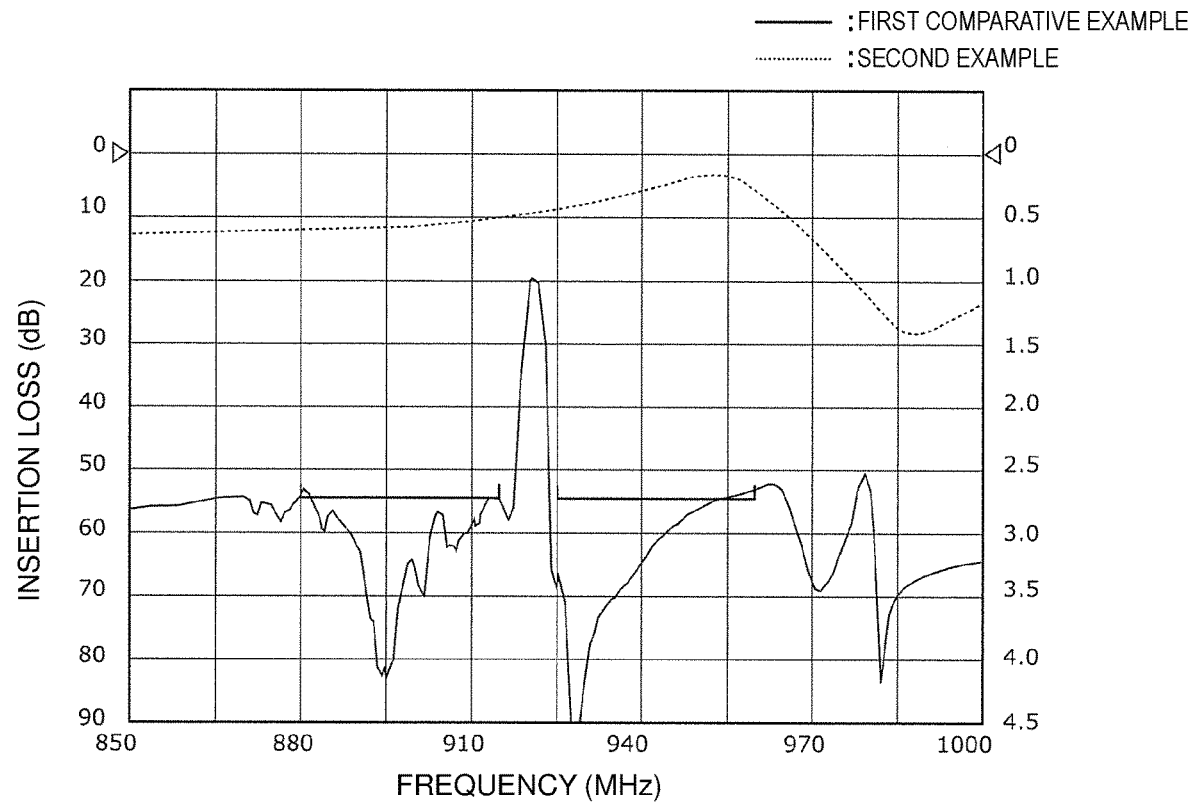
FIG. 10 illustrates the isolation characteristics of the multiplexer in the first comparative example and the amplitude characteristics of a longitudinally-coupled resonator in the second example of a preferred embodiment of the present invention.

FIG. 10 illustrates the isolation characteristics of the multiplexer in the first comparative example and the amplitude characteristics of the longitudinally-coupled resonator alone in the second example. In FIG. 10, the isolation characteristics of the multiplexer in the first comparative example are illustrated by a solid line, and the amplitude characteristics of the longitudinally-coupled resonator alone in the second example are illustrated by a dashed line.

When frequencies in the reception band of each multiplexer are higher than frequencies in the transmission band, and the transmission-side filter 10 includes a ladder filter, an attenuation pole appears in a lower range of the attenuation band of the ladder filter. For this reason, there is a tendency that attenuation increases in a lower range of the attenuation band of the ladder filter and decreases in a higher range thereof. In view of this, the resonant frequency of the capacitance element 32 of the multiplexer 100 according to the present preferred embodiment is in a higher range of the reception band of the multiplexer 100. As illustrated in FIG. 10, this makes the amplitude characteristics of the cancel circuit 130 closer to the isolation characteristics of the multiplexer 100 in the reception band. Accordingly, the isolation characteristics between the transmission-side filter 10 and the reception-side filter 20 of the multiplexer 100 in the second example in the reception band are better than those of the multiplexer 1 in the first example.

The cancel circuit 130 of the multiplexer 1 according to the present preferred embodiment preferably includes the capacitance element 32. This enables adjustment of the amplitude and phase of the cancel component that is in anti-phase with the component in the predetermined frequency band that flows along the first path that connects the common connection terminal 5 and the transmission-side terminal 6 to each other.

The capacitance element 32 is preferably the series arm resonator, which includes the elastic wave resonator, for example. The resonant frequency of the series arm resonator is in the pass band of the reception-side filter 20. This enables the amplitude characteristics of the cancel circuit 130 to be closer to the amplitude characteristics of the multiplexer 100 in the reception band. Accordingly, the isolation characteristics of the multiplexer 100 in the reception band are improved.

Although multiplexers according to preferred embodiments of the present invention are described above with the examples of the duplexer, the present invention is not limited to the examples. For example, modifications to the examples that are described below may be included in preferred embodiments of the present invention.

For example, the longitudinally-coupled resonator of each cancel circuit may be replaced by an elastic wave delay line. An elastic wave delay line may be used instead of the longitudinally-coupled resonator of each cancel circuit. The elastic wave delay line preferably includes at least one interdigital transducer electrode. The resonant frequency of the elastic wave delay line is higher than frequencies in the pass band of the first filter circuit and the pass band of the second filter circuit.

The cancel circuit may consist of the longitudinally-coupled resonator or the elastic wave delay line or may include another element, such as a capacitance element.

The cancel circuit may be connected to the transmission-side terminal 6, instead of the node M, and to the reception-side terminal 7, instead of the node N.

The number of the elastic wave resonators that are included in the longitudinally-coupled resonator is not limited to three and may be appropriately determined in accordance with the bandpass characteristic that the cancel circuit is required to have.

The structure of each elastic wave resonator that is included in the first filter circuit, the second filter circuit, and the cancel circuit is not limited to the above-described structure and may be appropriately modified. For example, the pitch between the electrode fingers of the interdigital transducer electrodes of the elastic wave resonators is not limited to the pitch described above and may be appropriately changed provided that the average pitch between the electrode fingers of the interdigital transducer electrodes of the elastic wave resonators that are included in the cancel circuit is narrower than the average pitch between the electrode fingers of the other interdigital transducer electrodes.

The piezoelectric substrate according to preferred embodiments of the present invention may be a substrate at least a portion of which has piezoelectricity. For example, the substrate may include a multilayer body including a piezoelectric thin film on a surface thereof, a film having an acoustic velocity which differs from that of the piezoelectric thin film, and a support substrate. The entire substrate may have piezoelectricity. In this case, the substrate is a piezoelectric substrate that includes a single piezoelectric layer.

Multiplexers according to preferred embodiments of the present invention are not limited to the duplexer in Band8 in each example. For example, each of the multiplexers according to preferred embodiments of the present invention may be a quadplexer to send and receive signals in two bands or a multiplexer to send and receive signals in three bands or more. Multiplexers according to preferred embodiments of the present invention may be used as a demultiplexer, or a diplexer that has reception frequency bands, or a demultiplexer, or a combiner that has transmission frequency bands.

In examples described according to preferred embodiments of the present invention, the transmission-side filter, the reception-side filter, and the longitudinally-coupled resonator that are included in each multiplexer are surface acoustic wave filters that include the interdigital transducer electrodes. However, the filters and the resonators that are included in multiplexers according to preferred embodiments of the present invention may be elastic wave filters and elastic wave resonators that use a boundary acoustic wave or a BAW (Bulk Acoustic Wave). Also, in this case, the advantageous effects the same as or similar to with the multiplexers according to the preferred embodiments are achieved.

An inductor or a capacitor, for example, may be connected between the components of each multiplexer. The inductor may include a wiring inductor that is defined by a wiring line that connects the components.

Preferred embodiments of the present invention may be widely used as multiplexers that each have a low loss and high isolation characteristics and that support a multi-band frequency standard for communication equipment, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common connection terminal into which a high-frequency signal is input and from which a high-frequency signal is output;
   a first terminal;
   a second terminal;
   a first filter circuit having a pass band in a first frequency band, the first filter circuit being connected between the common connection terminal and the first terminal;
   a second filter circuit having a pass band in a second frequency band that differs from the first frequency band, the second filter circuit being connected between the common connection terminal and the second terminal; and
   a cancel circuit connected between a first node on a first path that connects the common connection terminal and the first terminal to each other or to the first terminal and a second node on a second path that connects the common connection terminal and the second terminal to each other or to the second terminal to cancel out a component in a predetermined frequency band that flows along the first path and the second path; wherein
   the cancel circuit includes at least one longitudinally-coupled resonator, and an average pitch between electrode fingers of an interdigital transducer electrode of the at least one longitudinally-coupled resonator is narrower than an average pitch between electrode fingers of an interdigital transducer electrode of a resonator that determines the pass band of the first filter circuit and an average pitch between electrode fingers of an interdigital transducer electrode of a resonator that determines the pass band of the second filter circuit;
   the cancel circuit includes a capacitance element that includes a series arm resonator and is connected in series with the at least one longitudinally-coupled resonator; and
   a resonant frequency of the series arm resonator is in the second frequency band.

2. The multiplexer according to claim 1, wherein the capacitance element is connected to the first node of the cancel circuit or to the first terminal.

3. The multiplexer according to claim 1, wherein
   the first filter circuit includes a ladder filter; and
   frequencies in the second frequency band are higher than frequencies in the first frequency band.

4. The multiplexer according to claim 1, wherein the capacitance element is disposed only on one side of the cancel circuit.

5. The multiplexer according to claim 1, wherein the first filter circuit is a transmission-side filter and the second filter circuit is a reception-side filter.

6. The multiplexer according to claim 5, wherein the transmission-side filter is a surface acoustic wave filter.

7. The multiplexer according to claim 5, wherein the transmission-side filter is a ladder elastic wave filter circuit including a plurality of series arm resonators and a plurality of parallel arm resonators.

8. The multiplexer according to claim 5, wherein frequencies of the second frequency band are higher than frequencies of the first frequency band.

9. A multiplexer comprising:
a common connection terminal into which a high-frequency signal is input and from which a high-frequency signal is output;
a first terminal;
a second terminal;
a first filter circuit having a pass band in a first frequency band, the first filter circuit being connected between the common connection terminal and the first terminal;
a second filter circuit having a pass band in a second frequency band that differs from the first frequency band, the second filter circuit being connected between the common connection terminal and the second terminal; and
a cancel circuit connected between a first node on a first path that connects the common connection terminal and the first terminal to each other or to the first terminal and a second node on a second path that connects the common connection terminal and the second terminal to each other or to the second terminal to cancel out a component in a predetermined frequency band that flows along the first path and the second path; wherein
the cancel circuit includes at least one longitudinally-coupled resonator or at least one elastic wave delay line;
a resonant frequency of the at least one longitudinally-coupled resonator or the at least one elastic wave delay line is higher than frequencies in the pass band of the first filter circuit and the pass band of the second filter circuit;
the cancel circuit includes a capacitance element that includes a series arm resonator and is connected in series with the at least one longitudinally-coupled resonator or the at least one elastic wave delay line; and
a resonant frequency of the series arm resonator is in the second frequency band.

10. The multiplexer according to claim 9, wherein the first filter circuit is a transmission-side filter and the second filter circuit is a reception-side filter.

11. The multiplexer according to claim 10, wherein frequencies of the second frequency band are higher than frequencies of the first frequency band.

12. The multiplexer according to claim 10, wherein the transmission-side filter is a ladder elastic wave filter circuit including a plurality of series arm resonators and a plurality of parallel arm resonators.

13. The multiplexer according to claim 10, wherein the transmission-side filter is a surface acoustic wave filter.

14. The multiplexer according to claim 9, wherein the capacitance element is disposed only on one side of the cancel circuit.

15. The multiplexer according to claim 9, wherein the capacitance element is connected to the first node of the cancel circuit or to the first terminal.

16. The multiplexer according to claim 9, wherein
the first filter circuit includes a ladder filter; and
frequencies in the second frequency band are higher than frequencies in the first frequency band.

* * * * *